United States Patent [19]

Karam et al.

[11] Patent Number: 5,309,071
[45] Date of Patent: May 3, 1994

[54] ZINC SULFIDE ELECTROLUMINESCENT PHOSPHOR PARTICLES AND ELECTROLUMINESCENT LAMP MADE THEREFROM

[75] Inventors: Ronald E. Karam, Towanda, Pa.; Aaron Wold, East Greenwich, R.I.

[73] Assignee: Osram Sylvania Inc., Danvers, Mass.

[21] Appl. No.: 135,044

[22] Filed: Oct. 12, 1993

Related U.S. Application Data

[62] Division of Ser. No. 999,241, Dec. 31, 1992, Pat. No. 5,273,774.

[51] Int. Cl.⁵ .................................. H01J 1/63
[52] U.S. Cl. .............................. 313/509; 252/301.6 S; 428/403; 428/917; 313/503; 313/506
[58] Field of Search ................... 252/301.6 S; 427/66, 427/215; 428/403, 917; 313/503, 506, 509

[56] References Cited

U.S. PATENT DOCUMENTS

| | | | |
|---|---|---|---|
| 3,040,202 | 6/1962 | Lehmann | 252/301.6 S |
| 3,264,133 | 8/1966 | Brooks | 427/66 |
| 3,471,323 | 10/1969 | Yamashita et al. | 427/66 |
| 5,068,157 | 11/1991 | Won | 428/917 |
| 5,244,750 | 9/1993 | Reilly et al. | 428/403 |

*Primary Examiner*—Jack Cooper
*Attorney, Agent, or Firm*—Elizabeth A. Levy; Robert F. Clark

[57] ABSTRACT

A copper- and/or manganese-activated zinc sulfide electroluminescent phosphor is made by coating particles of a ferroelectric material with a very thin coating of the phosphor. The phosphor is made by reacting zinc- and copper- and/or manganese-containing species with hydrogen sulfide and hydrogen chloride gases in a low-temperature vapor state reaction.

3 Claims, 1 Drawing Sheet

5,309,071

ZINC SULFIDE ELECTROLUMINESCENT PHOSPHOR PARTICLES AND ELECTROLUMINESCENT LAMP MADE THEREFROM

CROSS-REFERENCE TO RELATED APPLICATIONS

This is a division of application Ser. No. 07/999,241, filed Dec. 12, 1992 now U.S. Pat. No. 5,273,774. This application is related to copending applications Ser. Nos. 999,243, 999,634, and 999,637.

TECHNICAL FIELD

This invention relates to copper- and/or manganese-activated zinc sulfide electroluminescent phosphors. In particular, it relates to methods of making copper- and/or manganese-activated zinc sulfide electroluminescent phosphors made by coating particles of a ferroelectric material with a very thin coating of the phosphor. It also relates to electroluminescent phosphors and electroluminescent lamps.

BACKGROUND ART

Electroluminescent lamps typically provide approximately 30 foot-lamberts of illumination and are thus suitable for various low-intensity illumination applications, such as decorative lighting, egress lighting, cockpit and dashboard display panels, and membrane switches. They have also been used as backlighting sources for liquid crystal display (LCD) devices. However, most LCD applications, including black/white and color LCD displays and high definition displays, require greater backlighting illumination than electroluminescent lamps can provide.

Zinc sulfide electroluminescent phosphors and methods of making them (including copper-activated zinc sulfide, manganese-activated zinc sulfide, and copper- and manganese-activated zinc sulfide) are described in U.S. Pat. Nos. 2,807,587 to Butler et al., 3,031,415 to Morrison et al., 3,031,416 to Morrison et al., 3,152,995 to Strock, 3,154,712 to Payne, 3,222,214 to Lagos et al., 3,657,142 to Poss, and 4,859,361 to Reilly et al., all of which are assigned to the assignee of the instant invention. However, none of these electroluminescent zinc sulfide phosphors are sufficiently bright for use in most LCD backlighting applications or high definition display devices.

It would be an advantage in the art to provide a copper- and/or manganese-activated zinc sulfide electroluminescent phosphor having improved luminance for use in LCD and high definition display devices, and a method of making the phosphor.

SUMMARY OF THE INVENTION

It is an object of the invention to obviate the disadvantages of the prior art.

It is another object of the invention to provide a copper- and/or manganese-activated zinc sulfide electroluminescent phosphor having improved luminance.

In accordance with one aspect of the invention, there is provided a copper- and/or manganese-activated zinc sulfide electroluminescent phosphor particles comprising the steps of: introducing particles made by a method of a ferroelectric material into a heated reactor vessel which is maintained at a reaction temperature of no greater than about 300° C. and fluidizing the ferroelectric particles therein, introducing zinc- and copper- and/or manganese-containing species as a finely dispersed vapor or mist into the heated reactor vessel, introducing a gaseous mixture comprising hydrogen sulfide gas and hydrogen chloride gas into the heated reactor vessel, and reacting the zinc- and copper- and/or manganese-containing species with the gases to form copper- and/or manganese-activated zinc sulfide electroluminescent phosphor particles consisting essentially of particles of the ferroelectric material coated with a very thin coating of copper- and/or manganese-activated zinc sulfide.

In accordance with another aspect of the invention, there is provided a copper- and/or manganese-activated zinc sulfide electroluminescent phosphor particles made by a method comprising the steps of: introducing particles of a ferroelectric material into a heated reactor vessel which is maintained at a reaction temperature which is not greater than about 300° C. and fluidizing the particles therein, introducing zinc- and copper- and/or manganese-containing species as a finely dispersed vapor or mist into the heated reactor vessel, introducing oxygen into the heated reactor vessel and reacting the zinc- and copper- and/or manganese-containing species with the oxygen to form a zinc oxide coating containing copper and/or manganese ions on the surfaces of the particles of the ferroelectric material, introducing a gaseous mixture comprising hydrogen sulfide gas and hydrogen chloride gas into the heated reactor vessel, and reacting the gases with the zinc oxide coating on the ferroelectric particles to form copper- and/or manganese-activated zinc sulfide electroluminescent phosphor particles consisting essentially of particles of the ferroelectric material coated with a very thin coating of copper- and/or manganese-activated zinc sulfide.

BEST MODE FOR CARRYING OUT THE INVENTION

Figure 1:
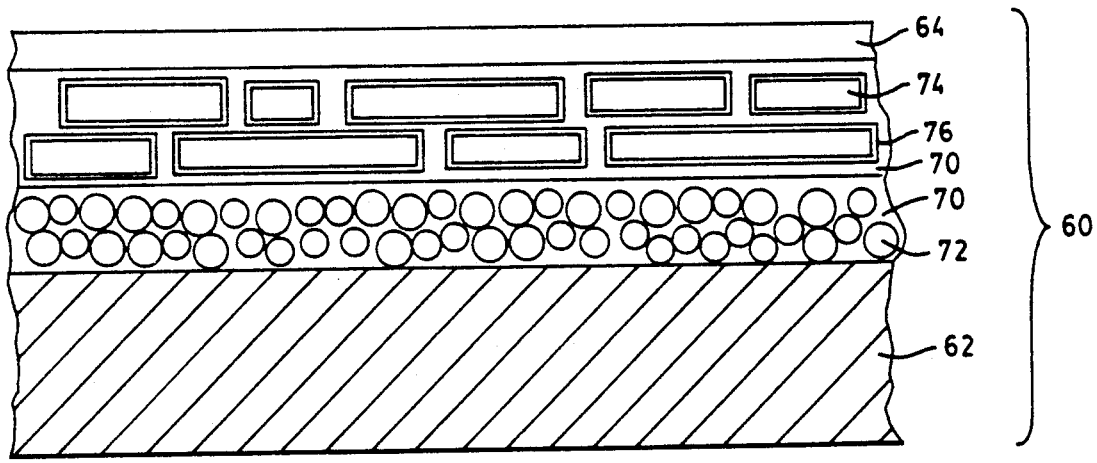
FIG. 1 is a schematic representation of the structure of an electroluminescent lamp made with composite particles of barium titanate coated with a very thin coating of copper- and/or manganese-activated zinc sulfide electroluminescent phosphor.

For a better understanding of the present invention, together with other and further objects, advantages and capabilities thereof, reference is made to the following specification and appended claims.

The luminescent intensity of an electroluminescent phosphor may be increased substantially if the effective electric field applied across the phosphor is increased. One way to concentrate the effective electric field across the phosphor, and thereby increase luminescent intensity, is to decrease the distance across which the electric field is applied, that is, to create very thin phosphor films. "Very thin" phosphor films, as the term is used herein, means phosphor films which are generally less than about 0.5 micrometers thick. Another way to increase luminescent intensity of the phosphor is to align the phosphor particles within the electric field so that the areas across which the electric field is concentrated are perpendicular to the direction of the applied electric field.

It is believed that increased electroluminescent phosphor luminance may be obtained by creating composite particles of an electroluminescent material which are capable of alignment under an applied electric field and which also effectively concentrate the applied electric field across the phosphor. Such a composite electroluminescent material may be made, for example, by coating particles of a highly polarizable ferroelectric material with a very thin coating of an electroluminescent phosphor. Ferroelectric materials are crystalline dielectric materials which are electrically nonconductive, yet highly polarizable under an applied electric field. Ferroelectric materials having an axially symmetric, or platelet-type, particle morphology are especially suitable for this application. By coating particles of a polarizable ferroelectric material with a very thin electroluminescent phosphor coating, the luminescent intensity of the electroluminescent phosphor may be substantially increased.

The instant method of making a copper- and/or manganese-activated zinc sulfide electroluminescent phosphor employs a low-temperature vapor state reaction between zinc- and copper- and/or manganese-containing species and a gaseous mixture of hydrogen sulfide gas, hydrogen chloride gas and, optionally, an inert carrier gas. The result of the reaction is a very thin coating of copper- and/or manganese-activated zinc sulfide on the surfaces of particles of a ferroelectric material.

According to the method of the invention, ferroelectric particles are introduced into a heated reactor vessel where they are fluidized in preparation for coating. The zinc- and copper- and/or manganese-containing species are provided by organic zinc and copper and/or manganese salts which, if solids, are dissolved in an organic solvent. The resulting liquid organic solution must be very finely dispersed so as to form a vapor or mist which is then introduced into the heated reactor vessel. The reactor vessel is heated to and maintained at a temperature which is not greater than about 300° C. If any of the organic zinc, copper and/or manganese salts is in the liquid phase, they may be introduced directly into the heated reactor vessel as a finely dispersed vapor or mist, without dissolution in an organic solvent. A gaseous mixture of hydrogen sulfide gas, hydrogen chloride gas and, optionally, an inert carrier gas is also introduced into the heated reactor vessel, where the gases react with the zinc- and copper- and/or manganese-containing species and the ferroelectric particles. The product of the reaction is a very thin coating of copper- and/or manganese-activated zinc sulfide phosphor on the surfaces of the ferroelectric particles.

The organic zinc salt may be, for example, zinc dithiocarbamate, zinc acetylacetonate or zinc acetate, which are solids at room temperature, or dimethyl zinc, which is a liquid at room temperature. If zinc dithiocarbamate is used, the reaction may proceed according to Equation 1:

$$Zn(CS_2NR_2)_2 + H_2S \rightarrow ZnS + 2CS_2 + 2R_2NH \qquad [1]$$

where R represents either ethyl or n-butyl groups. If zinc acetylacetonate is used, the reaction may proceed according to Equation 2:

$$Zn(C_5H_7O_2)_2 + 9H_2S \rightarrow ZnS + 6CH_4 + 4H_2O + 4CS_2 \qquad [2]$$

If dimethyl zinc is used, the reaction may proceed according to Equation 3:

$$(CH_3)_2Zn + H_2S \rightarrow ZnS + 2CH_4 \qquad [3]$$

Alternatively, a modified process involving zinc acetate as the source of the zinc-containing species may be employed. The ferroelectric particles are first fluidized in the reactor vessel. Zinc- and copper- and/or manganese-containing species are introduced as a finely dispersed vapor or mist into the heated reactor vessel. Oxygen gas is then introduced into the heated reactor vessel to react with the zinc- and copper- and/or manganese-containing species. A zinc oxide coating containing copper or manganese ions forms on the surfaces of the ferroelectric particles. A gaseous mixture of hydrogen sulfide gas, hydrogen chloride gas and, optionally, an inert carrier gas is then introduced into the heated reactor vessel. The zinc oxide coating reacts with the gases to form a very thin copper- and/or manganese-activated zinc sulfide coating on the surfaces.

The reaction using zinc acetate may proceed according to equation 4:

$$(C_2H_3O_2)_2Zn_2 + 4O_2 \rightarrow ZnO + 4CO_2 + 3H_2O \qquad [4]$$

The copper and/or manganese activators may be added as an organic copper or manganese salt, such as, for example, copper or manganese dithiocarbamate, copper or manganese acetylacetonate, or dimethyl copper or dimethyl manganese. The chlorine coactivator may be provided by the hydrogen chloride gas in the gaseous mixture.

Regardless of which organic zinc and copper and/or manganese salts are used, they must be dissolved in an organic solvent if they are solids. Suitable organic solvents include, but are not limited to, toluene, alcohol, dimethyl formamide (DMF) and dimethyl sulfoxide (DMSO). The resulting organic solution contains both zinc- and copper- and/or manganese-containing species and may then be dispersed by ultrasonic means, such as by an ultrasonic nebulizer, as a finely dispersed vapor or mist into a reactor vessel. The reactor vessel is heated to and maintained at a reaction temperature which is no greater than about 300° C.

A gaseous mixture comprising hydrogen sulfide gas and hydrogen chloride gas and, optionally, an inert carrier gas, such as, for example, argon or nitrogen, is also introduced into the heated reactor vessel. The gases react with the zinc- and copper- and/or manganese-containing species to form a very thin copper- and/or manganese-activated zinc sulfide phosphor coating on the surfaces of the particles of the ferroelectric material.

The ferroelectric material may be, for example, barium titanate, $BaTiO_3$. Particles of the ferroelectric material are introduced into the heated reactor vessel and fluidized therein. For optimum luminescence, it is desirable to use a ferroelectric material having an axially symmetric, or platelet-type, particle morphology.

Various other methods of coating ferroelectric particles with electroluminescent material, for example, sputter-coating methods, chemical vapor deposition methods, and thermal evaporation methods, may be employed to obtain a composite electroluminescent material as described herein.

FIG. 1 is a schematic representation of the structure of an electroluminescent lamp 60. A conductive substrate material, such as aluminum or particles of graphite dispersed in an organic binder, forms a first electrode 62 of the lamp 60, while a transparent conductive film, such as indium tin oxide, forms a second electrode 64.

Sandwiched between the two conductive electrodes 62 and 64 are two additional layers of dielectric material 70 which can be, for example, cyanoethyl cellulose or cyanoethyl starch. Adjacent to the first electrode 62 is a layer of dielectric material 70 in which may be embedded particles of a ferroelectric material 72, such as, for example, barium titanate. Adjacent to the second electrode 64 is a layer of dielectric material 70 in which may be embedded with platelet-type ferroelectric particles 74 coated with a very thin layer 76 of an electroluminescent phosphor, according to the invention.

While there have been shown what are at present considered to be the preferred embodiments of the invention, it will be apparent to those skilled in the art that various changes and modifications can be made herein without departing from the scope of the invention as defined by the appended claims.

We claim:

1. A copper- and/or manganese-activated zinc sulfide electroluminescent phosphor consisting essentially of particles of platelet-type ferroelectric material the surfaces which are coated with a layer of copper- and/or manganese-activated zinc sulfide electroluminescent phosphor of a thickness less than about 0.5 micrometers.

2. A copper- and/or manganese-activated zinc sulfide electroluminescent phosphor according to claim 1 wherein said platelet-type ferroelectric material is barium titanate.

3. An electroluminescent lamp comprising a pair of conductive electrodes separated by two layers of dielectric material in one of which are embedded particles of a ferroelectric material and in the other particles of an electroluminescent phosphor, said phosphor consisting essentially of particles of a platelet-type ferroelectric material the surface of which are coated with a layer of copper- and/or manganese-activated zinc sulfide electroluminescent phosphor of a thickness less than about 0.5 micrometers.

* * * * *